US008893066B2

(12) United States Patent
Chen et al.

(10) Patent No.: US 8,893,066 B2
(45) Date of Patent: Nov. 18, 2014

(54) PARASITIC COMPONENT LIBRARY AND METHOD FOR EFFICIENT CIRCUIT DESIGN AND SIMULATION USING THE SAME

(71) Applicant: Taiwan Semiconductor Manufacturing Co., Ltd., Hsin-Chu (TW)

(72) Inventors: Chin-Sheng Chen, Taoyuan (TW); Tsun-Yu Yang, Changhua (TW); Wei-Yi Hu, Zhubei (TW); Tao Wen Chung, San Jose, CA (US); Jui-Feng Kuan, Zhubei (TW); Yi-Kan Cheng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/728,295

(22) Filed: Dec. 27, 2012

(65) Prior Publication Data

US 2014/0189623 A1 Jul. 3, 2014

(51) Int. Cl.
*G06F 9/455* (2006.01)
*G06F 17/50* (2006.01)

(52) U.S. Cl.
CPC ........ *G06F 17/5009* (2013.01); *G06F 17/5081* (2013.01); *G06F 17/5045* (2013.01)
USPC ............ 716/111; 716/106; 716/107; 716/110

(58) Field of Classification Search
USPC .......................................................... 716/111
See application file for complete search history.

(56) References Cited

U.S. PATENT DOCUMENTS

| 6,421,814 B1 * | 7/2002 | Ho ................................. 716/113 |
| 8,261,228 B1 * | 9/2012 | Gopalakrishnan et al. ... 716/136 |

* cited by examiner

*Primary Examiner* — Jack Chiang
*Assistant Examiner* — Eric Lee
(74) *Attorney, Agent, or Firm* — Duane Morris LLP

(57) ABSTRACT

A method for circuit design includes a parasitic aware library embedded with one or more parameterized cells. The parasitic aware library is used to insert nets representing some but not all parasitic effects of a circuit into a circuit schematic enabling a single circuit schematic to be used for simulation of the circuit, parasitic verification of the circuit and LVS (Layout Versus Schematic) check. Only the single circuit schematic is required for the circuit design process and to form a mask set. Critical paths of the single circuit schematic are identified and parasitic effects are extracted and inserted into the schematic, enabling a pre-estimation of parasitic verification to be carried out and the LVS check to be carried out using a circuit schematic with some parasitic effects prior to the post-layout simulation in which all parasitic components of the layout are included.

19 Claims, 3 Drawing Sheets

PARASITIC COMPONENT LIBRARY AND METHOD FOR EFFICIENT CIRCUIT DESIGN AND SIMULATION USING THE SAME

TECHNICAL FIELD

The disclosure relates to the design of integrated circuits and other semiconductor devices.

BACKGROUND

Integrated circuits and other semiconductor devices are prevalent in all aspects of today's world. The integrated circuits or other semiconductor devices are formed on tiny substrates which are typically made of semiconductor materials and are called chips. Many components that are conventionally considered to be electronic components, and various other products in today's marketplace, utilize one or several chips, i.e. they utilize one or several integrated circuits or other semiconductor devices, which will hereinafter be referred to collectively as integrated circuits. Each integrated circuit includes a unique design.

The design of each integrated circuit is a painstakingly detailed process of selecting, positioning, combining and interconnecting various active and other components to form the integrated circuit. The design procedure includes producing a circuit schematic, i.e. a circuit diagram of the integrated circuit, testing the circuit schematic and simulating operation of the integrated circuit using a netlist of the circuit schematic.

The chips are formed of multiple material layers and include various active devices such as transistors and many other devices such as resistors, capacitors and the like. These devices are formed using one or more material layers formed over the substrate used for the chip, and the substrate itself. Intricate patterning techniques are used to pattern each of several material layers to form the various components and interconnect them through dielectric materials. In order to form an integrated circuit on a chip, a layout of each of several different device layers must be generated from the schematic of the electrical circuit diagram.

Prior to carrying out any fabrication operation to manufacture the chip, both the electronic circuit diagram, i.e. schematic, and the device layout must be tested. More particularly, both a netlist of the circuit diagram and a netlist representative of the layout database, must be tested.

The circuit schematic must be also compared to the layout. LVS, "Layout Versus Schematic," is a type of electronic design automation ("EDA") verification that determines whether a particular integrated circuit layout corresponds to the schematic or circuit diagram of the design. LVS checking software recognizes the drawn shapes of the layout that represent the electrical components of the circuit, and vice versa, as well as the connections between the components. This netlist that represents the drawn shapes of the layout that represent electrical components is compared by the LVS software against a netlist of the schematic or circuit diagram.

The operation and performance of the manufactured chip often depends on artifacts of the layout that are not present in the circuit schematic. Parasitic effects such as parasitic capacitance, parasitic inductance and parasitic resistance come into play and affect circuit operation and performance. These and other parasitic effects are due to the arrangement and proximity of components and interconnect features in the three-dimensional circuit produced. Such effects must be taken into account in simulating operation of the circuit prior to manufacture.

In current design methods, one circuit schematic without parasitic components is maintained and used to generate a layout and is used in the LVS check. A separate circuit schematic with a pre-estimate of parasitic components is maintained and used to test for estimated parasitic capacitance, parasitic inductance and parasitic resistance.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
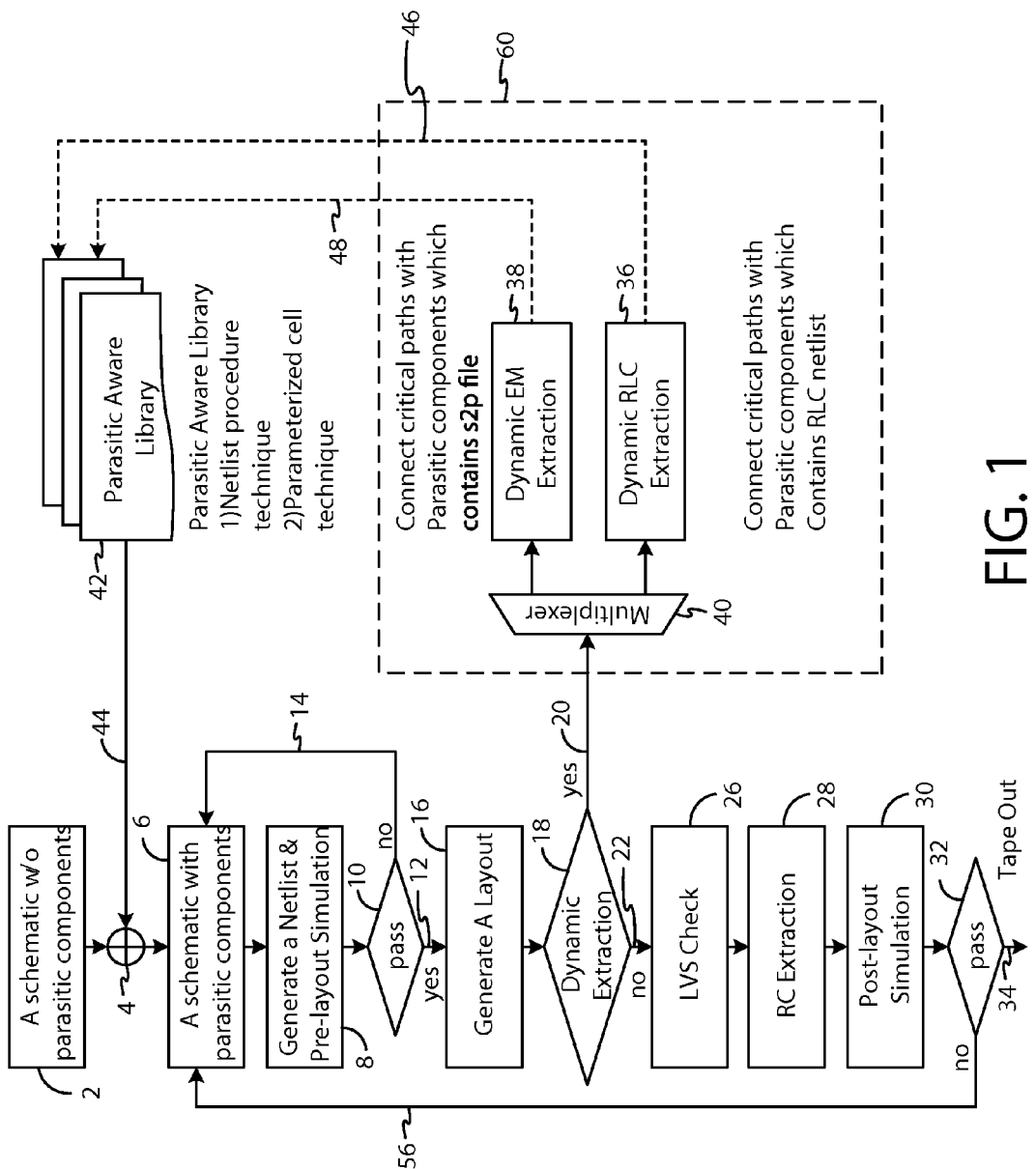
FIG. 1 is a flowchart showing an embodiment of a design method of the disclosure.

The disclosure provides a method for carrying out integrated circuit design. The disclosure provides a parasitic aware library embedded with one or more parameterized cells that transfers basic parasitic components into open/short parasitic components for circuit-design simulation and LVS (layout vs. schematic) verification. The parasitic aware library also includes parasitic aware components associated with critical paths selected by a designer and the parasitic aware library is capable of providing netlists of these parasitic aware components for insertion into the circuit schematic. The parasitic aware library is capable of simulating basic parasitic components by providing an RLC ("resistor-inductor-capacitor") netlist file or an s2p file for EM parasitic effects for circuit design simulation with parasitic effects.

Parasitic components from the furnished parasitic aware library are used by designers to pre-estimate parasitic effects according to one embodiment.

A single schematic of a design layout is used to run simulation, parasitic verification and LVS (layout vs. schematic) check. The design method of the disclosure is applicable to various processes used to form various types of integrated circuits and other semiconductor devices including but not limited to CMOS devices, BiPolar devices, FinFET devices, RF devices and various other devices.

The parasitic effects of the various circuit components influence device performance and are taken into account by providing a schematic of a circuit design that includes a netlist of the parasitic effects, i.e. netlists of parasitic effects representative of parasitic components associated with identified critical paths. In one embodiment, the method provides for dynamically and automatically extracting some parasitic effects at identified critical paths. The parasitic effects may be extracted from an existing parasitic aware library associated with the layout and the disclosure provides for maintaining the parasitic aware library and automatically inserting the parasitic effects into the schematic from the library. In some embodiments, the parasitic aware library is used by a dynamic extraction method as will be described below. Electromagnetic ("EM") parasitic effects and resistor-inductor-capacitor ("RLC") parasitic effects are extracted from the layout by identifying critical paths and they are inserted into the schematic at critical paths of the schematic. The circuit designer selects nets, i.e. critical paths, using a schematic view of the circuit and the dynamic RLC/EM extraction methodology associates, i.e. connects, the critical paths with parasitic RLC/EM components and provides a netlist of RLC effects and/or an s2p file associated with EM parasitic components.

A dynamic link between the selected nets and a parasitic aware library communicates the selected nets at the schematic view, to the parasitic aware library. Parasitic aware components of the parasitic aware library that are related to the selected nets, i.e. critical paths, are identified and linked and the RLC netlist and/or s2p file is inserted into the circuit schematic.

A netlist of the entire circuit schematic with the parasitic effects inserted at critical paths is thus provided. A pre-layout simulation is carried out on the aforementioned netlist. The pre-layout simulation carried out with some inserted parasitic components enables the evaluation of parasitic effects at critical paths without having to extract and insert all parasitic components. This saves time. If the pre-layout simulation is successful, a layout is generated, and an LVS check is performed. One aspect of the disclosure is that the LVS verification can be carried out with some embedded parasitic effects, i.e. upon the netlist of the entire circuit schematic with inserted parasitic effects. The basic parasitic components are converted into open/short parasitic components for the LVS verification. At the LVS check, if the extracted layout netlist matches the netlist of the circuit schematic, the circuit passes LVS check. For post-layout simulation, all parasitic components may be extracted from the layout and inserted as a netlist of the entire circuit. Using the netlist of the entire circuit with all inserted parasitic components, post layout simulation is then carried out.

According to one aspect, a method for semiconductor device circuit design using a single circuit schematic for simulation, parasitic verification, and comparison to a layout, is provided. The method comprises: providing a circuit schematic without parasitic effects; inserting some parasitic effects into the circuit schematic at identified circuit paths; simulating operation of the circuit using the circuit schematic with the inserted some parasitic effects; generating a layout of the semiconductor device circuit if the circuit schematic operates according to specification in the simulation step; and comparing the layout to the circuit schematic with the inserted some parasitic effects. The method further comprises inserting all the parasitic effects of the layout, into the circuit schematic thereby providing a netlist of a parasitic-effect containing circuit; and carrying out a post-layout circuit simulation of the parasitic-effect containing circuit using the netlist of the parasitic-effect containing circuit.

According to another aspect, a method for semiconductor device circuit design, is provided. The method comprises using a single circuit schematic for simulation, parasitic verification and comparison to a layout. After the using step, the method provides for inserting all parasitic components of the layout, into the single circuit schematic thereby providing a parasitic-component containing version of the single circuit schematic and producing a non-transitory computer readable storage media with instructions for building a mask set for the semiconductor device based on the parasitic-component containing version of the single circuit schematic.

According to another aspect, a method for circuit design using a single circuit schematic for simulation, parasitic verification, and comparison to a layout, is provided. The method comprises: providing a circuit schematic; identifying critical paths on the circuit schematic; accessing a library in which the critical paths are associated with estimated parasitic components; inserting the estimated parasitic components into the circuit schematic; generating a netlist of the circuit using the circuit schematic with the inserted estimated parasitic components; first simulating operation of the circuit using the netlist; generating a layout of the semiconductor device; and comparing the circuit schematic with the inserted estimated parasitic components, to the layout.

According to the method and parasitic aware library of the disclosure, pre-layout simulation, parasitic verification and comparison to a layout can be achieved using only a single schematic view. The design flow implementation is streamlined and design cycle time is reduced. Because two schematic views are not required, confusion is avoided and mistakes in using the incorrect schematic are prevented.

Now turning to FIG. 1, a flowchart showing an embodiment of a design method of the disclosure is provided. FIG. 1 shows that the method of the disclosure includes return loops in which some steps of the method of the flowchart are repeated. In FIG. 1, a schematic view of a circuit design without parasitic components is provided at step 2. The schematic view is provided in various formats in various embodiments. The schematic view may be provided in various non-transitory computer readable storage media, in various embodiments. The non-transitory computer readable storage media may be generated by and readable by various electronic design automation ("EDA") systems and CAD (computer aided design) systems, in various embodiments.

At insertion point 4, parasitic effects in the form of a netlist of parasitic components from parasitic aware library 42 is inserted at critical paths of the schematic of the circuit diagram to provide one or more parameterized cells. In one embodiment, the parasitic components are derived from a layout. In one embodiment, the parasitic components derived from a layout are derived using a dynamic extraction process such as dynamic extraction process 60 described below. In another embodiment, an accessible parasitic aware library 42 is maintained and includes a netlist of various R, L, C components, s2p files and various other parasitic components and the parasitic components are derived from the parasitic aware library.

According to one exemplary embodiment, the initial pass of the design sequence does not include the insertion of a netlist of parasitic components at insertion point 4 because it precedes the creation of the layout. According to the embodiment in which the layout has been created as will be described below, for example a second pass, parasitic components are inserted at insertion point 4. According to another embodiment, a netlist of parasitic components may be inserted at insertion point 4 from parasitic aware library 42, which includes nets of parasitic components associated with critical paths that can be identified at the schematic view. According to this embodiment, parasitic aware library 42 is previously provided and includes netlists of parasitic components such as described herein and s2p files, and has been previously provided.

The design method proceeds to step 6 which includes the production of a schematic with parasitic components. More particularly, the schematic includes some parasitic components that were extracted and inserted as RLC parasitic component netlists and/or s2p files, at critical paths in dynamic extraction process 60, to create the schematic. In some embodiments, some, but not all of the parasitic components from the layout are inserted. In one embodiment, only about 25% of all parasitic components are identified and inserted at critical paths. The percentage of overall parasitic components identified to be inserted at critical paths can vary, and may be determined by the designer or other user. In some embodiments, only a minimal number of critical paths associated with the schematic are identified and netlists or s2p files of parasitic components associated with the identified critical paths in the parasitic aware library, are inserted. At step 8, a netlist of the schematic is generated from the entire circuit including the some parametric components that were inserted at critical paths at insertion point 4. Also at step 8, a pre-layout simulation is carried out. The pre-layout simulation represents a simulation of the netlist of the schematic of the entire circuit including the some parametric components.

According to one embodiment, in the first pass of the design method, no parasitic components are inserted at insertion point 4, and the generation of the netlist and the pre-layout simulation are carried out without inserted parasitic components.

Returning to the embodiment in which some parasitic components are inserted at insertion point 4, the design method proceeds to evaluation step 10. The simulation of circuit operation is evaluated at evaluation step 10 and if the simulation fails, e.g. the circuit is not functional, or does not perform according to specification, i.e. "no" 14, the process returns to step 6 to fine-tune circuit design of the schematic and the netlist and pre-layout simulation of step 8 is carried out again. If the pre-layout simulation passes, "yes" 12, a layout is generated at step 16. Various factors are used to determine pass/fail of the pre-layout simulation at evaluation step 10, in various embodiments. In many embodiments, a specification with acceptable device operation and performance is established and used and the operation and performance of the circuit is evaluated to see whether it passes or fails specification. Various techniques and various suitable EDA, electric design automation, software and tools and various suitable CAD (computer aided design) systems are available and are used to generate the layout from the original schematic/circuit diagram. Other methods are used in other embodiments. The layout database includes layouts for each of several different layers of the integrated circuit. The various components and connections represented by the schematic of the circuit diagram, are transformed into physical structures formed of various device layers and using various device features that will appear on the manufactured chip.

A decision as to whether to utilize dynamic extraction of parasitic components is made at dynamic extraction step 18. In a first pass along the design method, the designer may advantageously choose "yes" 20 and carry out dynamic extraction. In other embodiments, if dynamic extraction is not desired or if the dynamic extraction process 60 has been carried out one or multiple times, option "no" 22 may be chosen at dynamic extraction at step 18. If option "no" 22 is chosen, the method proceeds to LVS check 26, and avoids optional dynamic extraction process 60 which is thus shown in dashed lines.

According to an embodiment in which dynamic extraction is selected, "yes" 20, multiplexer 40 is used for dynamic EM extraction 38 and dynamic RLC extraction 36. For dynamic RLC extraction 36 and dynamic EM extraction 38, designers or other users identify nets, i.e. critical paths from the layout (as will be shown in FIGS. 4A, 4B) and the parasitic components of these identified critical paths are automatically extracted from the layout and automatically inserted by way of parasitic aware library 42 into the schematic. Some basic parasitic components such as parasitic resistance, parasitic inductance, and parasitic capacitance and s2p files are simulated and added on nets to the schematic. Other parasitic components may be extracted and inserted in other embodiments. The s2p file format is a touchstone file format for n-port S-parameters also known as scattering parameters and which describe the electrical behavior of linear electrical networks when undergoing various steady state stimuli by electrical signals. The identified nets, i.e. critical paths, are delivered via dynamic links 48 and 46, respectively, to parasitic aware library 42, where they are associated with related parasitic aware components in parasitic aware library 42 and delivered along path 44 to insertion point 4 where they are inserted on nets into the schematic to produce the netlist of the schematic with parasitic components, at step 6.

The design process sequence then proceeds from step 6 as described above and returns to dynamic extraction step 18, where optional dynamic extraction process 60 may again be carried out in some embodiments. If a further dynamic extraction process 60 is not elected, "no" 22, LVS check 26 is next. At LVS check 26, a netlist extracted from the layout is compared to the netlist from the circuit schematic. At the LVS check 26, the basic parasitic components used to estimate parasitic effects at the schematic view are converted to basic mode or short/open mode parasitic components for LVS verification. A user friendly GUI or other suitable instrument or technique is used to convert into basic mode or open/short mode. LVS check 26 determines if the layout corresponds to the circuit represented by the schematic and the disclosure provides the advantage that the LVS check uses the schematic with parasitic effects of parasitic components at identified critical paths.

If the LVS check 26 passes, RC extraction takes place at step 28. At step 28, all of the parasitic components from the design layout are extracted from the layout and added as nets to the circuit schematic. The netlist of the parasitic-component containing circuit now includes all parasitic components and this netlist is used to carry out post-layout simulation at step 30.

The post-layout simulation at step 30 represents a simulation of a netlist of the entire circuit, including precise parasitic effects of all parasitic components extracted from the entire layout. According to one embodiment, the netlist file used to run post-layout simulation in step 30 can be obtained using batch mode to extract parasitic components from the layout and produce a netlist file directly. In another embodiment, the netlist file used to run post-layout simulation is obtained by using GUI mode to create a new view or representation of the circuit, and then obtain the netlist file from the new GUI-created view or representation of the circuit. An evaluation is made at pass/fail evaluation step 32. If the post-layout simulation does not pass, "no" 56, the method returns to step 6. If the post-layout simulation passes, "yes" 34, tapeout or other actions take place. Tapeout is the formation of a tape or tapes that represent the layout and the tape or tapes is used at the mask foundry to create a mask set of the layout. In one embodiment, the tape or tapes are a computer readable non-transitory storage media with instructions for building an entire mask set for the semiconductor device.

Figure 3:
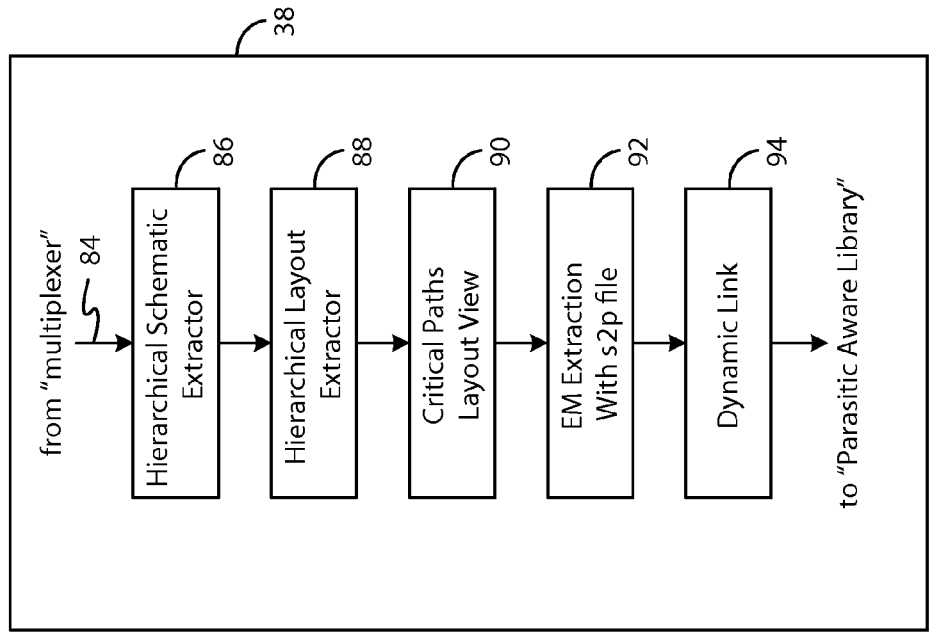
FIG. 3 is a flowchart showing a sequence of steps for dynamic EM extraction also shown in FIG. 1.
Figure 2:
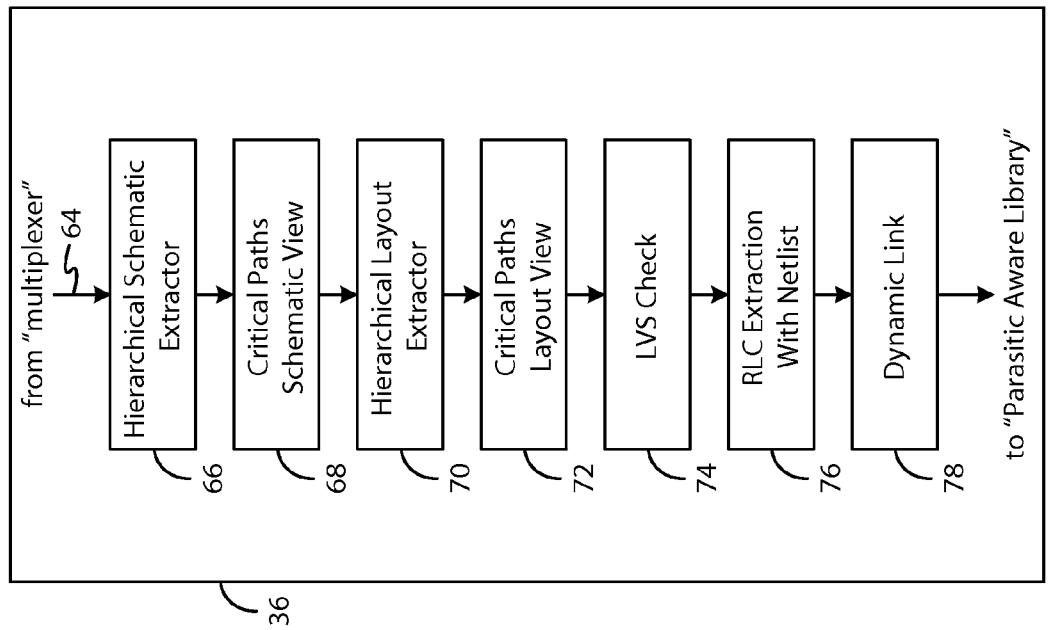
FIG. 2 is a flowchart showing a sequence of steps for dynamic RLC extraction also shown in FIG. 1.

FIGS. 2 and 3 are flowcharts showing a sequence of steps for dynamic RLC extraction and for dynamic EM extraction also shown in FIG. 1. Using the schematic view, the designers select the nets (critical paths) and then dynamic RLC and EM extraction methodology provides RLC netlists and s2p files for EM components. Once the critical path is selected, related parasitic components associated with the layout are located in the parasitic aware library 42 and these parasitic components are then inserted into the circuit schematic.

FIG. 2 shows dynamic RLC extraction 36 according to one embodiment of the disclosure. The illustrated RLC extraction embodiment includes signal 64 from multiplexer 40 directing hierarchical extraction of RLC parasitic components responsive to some critical paths, i.e. nets, having been selected. In the illustrated embodiment, the dynamic RLC extraction sequence includes hierarchical schematic extraction of RLC parasitic components at step 66, carried out using the critical path schematic view at step 68, and the hierarchical layout extraction at step 70 carried out using the critical paths layout view at step 72. LVS check step 74 includes the LVS check of critical path schematic view generated at step 68 and critical paths layout view generated at step 72. RLC extraction, i.e. the extraction of the identified RLC parasitic components at critical paths, takes place at RLC extraction at step 76 if LVS check step 74 passes. A netlist of the RLC parasitic components is produced at step 76. The dynamic link 78 of the netlist of the RLC parasitic components is sent to parasitic aware library 42 (see FIG. 1) at step 78.

FIG. 3 shows an embodiment of dynamic EM extraction 38. Signal 84 from multiplexer 40 directs hierarchical schematic extraction of EM parasitic components at step 86. Hierarchical layout extraction of EM parasitic components takes place at hierarchical layout extraction step 88 and is carried out using critical paths layout view at step 90. The critical paths layout view is generated at step 90. The extraction of electromagnetic parasitic components takes place at step 92, EM extraction with s2p file. In some embodiments, the s2p file or other representations of EM parasitic components may be tested for correlation between the schematic and layout. A dynamic link 94 of the s2p file is then sent to the parasitic aware library 42 as shown in FIG. 1.

Figures 4A, 4B:
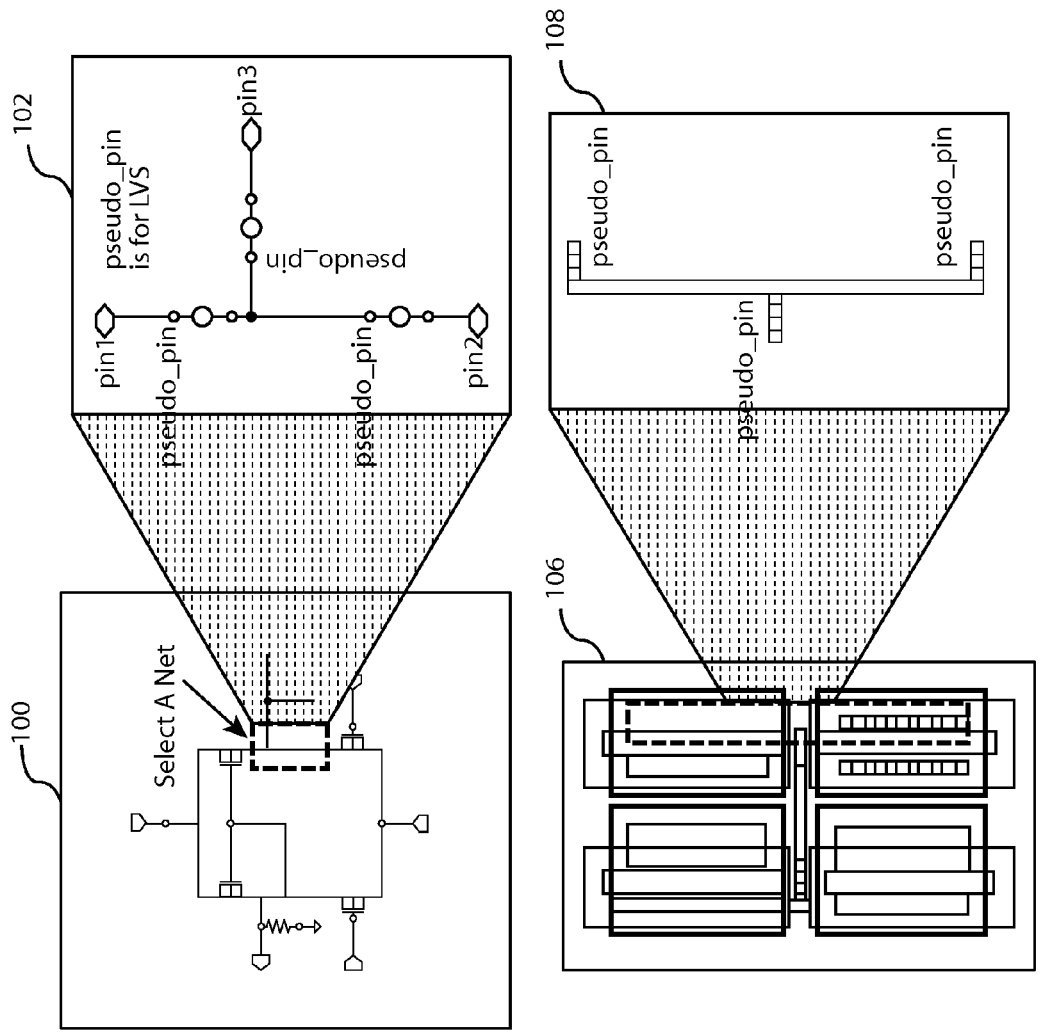
FIGS. 4A and 4B are graphical representations showing schematic dynamic RC extraction for critical paths showing schematic and layout views of critical paths, according to an embodiment of the disclosure and in accordance with one embodiment of the flowchart of FIG. 2.

One embodiment showing the selection of the critical paths such as used in dynamic RLC extraction 36 is shown in FIGS. 4A and 4B. The dynamic RLC extraction 36 shown in FIG. 2 is carried out using various CAD tools in various embodiments and it should be understood that FIGS. 4A and 4B represent one embodiment of the dynamic RLC extraction 36 shown in FIG. 2. The extraction techniques shown in FIGS. 4A and 4B are carried out by a Cadence Virtuoso tool in one embodiment, but other suitable tools are used in other embodiments.

FIGS. 4A and 4B illustrate aspects of dynamic RLC extraction 36 shown in FIGS. 1 and 2. A dynamic link technique is used to connect nets selected at the schematic view, to parasitic components with a parasitic netlist file at the circuit design view. Hierarchical schematic extraction is used to build a new schematic view which contains critical paths, generated by selecting critical paths on the schematic view. A new layout view that contains critical paths, is generated by selecting nets at the schematic view, as shown in FIGS. 4A and 4B.

FIG. 4A shows the selection of critical paths at the schematic view and FIG. 4B shows critical paths associated with the layout view. The new layout view of FIG. 4B is generated by the selection of critical paths at the schematic view as in FIG. 4A. In FIG. 4A, schematic 100 includes identified critical paths 102 shown as part of schematic 100 and in an expanded view to the right-hand side of schematic 100. Identified critical paths 102 are the nets identified by the designer for which parasitic estimates are desired. By selecting these critical path nets on the schematic, an associated parasitic component such as shown in the layout view of FIG. 4B, is identified. Various techniques may be used to identify and select the critical path nets of the schematic (see "Select A Net" in schematic 100 of FIG. 4A) in various embodiments. After extracting the parasitic netlist file, a related/specific parasitic component is used and inserted into the circuit schematic, e.g. nets and critical paths, and then stored in the circuit schematic. FIG. 4B shows layout 106 and identified critical path 108 shown in layout view. In each case, the identified critical paths are nets that couple one component to another and which are representative of parasitic components at the identified critical paths. A netlist is formed of the nets identified. In various embodiments, the two netlists associated with FIGS. 4A and 4B are compared in a partial LVS check, i.e. the net of the circuit schematic shown in FIG. 4A is compared and verified against the net of the layout schematic shown in FIG. 4B. FIGS. 4A and 4B show "pseudo pins" in both identified critical paths 102 of FIG. 4A and identified critical paths 108 of FIG. 4B and these "pseudo pins" are used to connect to the selected net/critical path and are also used for the partial LVS check, in one embodiment.

Various techniques are available and may be used by the designer to select critical paths to be dynamically extracted and inserted. In one embodiment, schematic 100 is displayed on a GUI and a mouse or other means is used to identify and select the critical paths. Other techniques are used in other embodiments. Hierarchical schematic extraction methods are used to extract the nets of the critical paths of the schematic and to provide a new schematic view containing parasitic components inserted at critical paths only. The netlist of parasitic components at associated critical paths is then inserted into the schematic at insertion point 4 as in FIG. 1.

As shown in FIG. 1, parts of the method of the disclosure can be repeated. For example, the dynamic extraction process 60 may be carried out multiple times if the designer chooses to carry out dynamic extraction at a second or a third, etc., iteration of dynamic extraction step 18. According to such embodiments, further identified circuit paths may be extracted and inserted as described above.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions.

The word "exemplary" is used herein to mean "serving as an example or illustration." Any aspect or design described herein as "exemplary" is not necessarily to be construed as preferred or advantageous over other aspects or designs.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly,"

"upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for semiconductor device circuit design using a single circuit schematic for simulation, parasitic verification, and comparison to a layout, said method comprising:
   providing a circuit schematic without parasitic effects to a computer;
   inserting some but not all parasitic effects into said circuit schematic at identified circuit paths through dynamic extraction, using said computer;
   simulating operation of said circuit using said circuit schematic with said inserted some but not all parasitic effects using said computer;
   generating a complete layout of said semiconductor device circuit using said circuit schematic with said inserted some but not all parasitic effects if said circuit schematic with said inserted some but not all parasitic effects, operates according to specification in said simulating, using said computer;
   comparing said complete layout to said circuit schematic with said inserted some but not all parasitic effects by performing an LVS (Layout Versus Schematic) check using said computer;
   inserting all said parasitic effects of said complete layout, into said circuit schematic thereby providing a netlist of a parasitic effects containing circuit; and
   carrying out a post-layout circuit simulation of said parasitic effects containing circuit using said netlist of said parasitic effects containing circuit.

2. The method as in claim 1, wherein said inserting some parasitic effects into said circuit schematic at identified circuit paths comprises inserting resistor-inductor-capacitor ("RLC") parasitic effects and inserting electromagnetic ("EM") parasitic effects.

3. The method as in claim 2, wherein said inserting said EM parasitic effects comprises inserting an s2p file including said EM parasitic effects.

4. The method as in claim 3, wherein said inserting comprises inserting a netlist of said parasitic RLC effects and inserting said s2p file.

5. The method as in claim 1, wherein said inserting some parasitic effects further comprises dynamically extracting said some parasitic effects from said circuit schematic.

6. The method as in claim 5, wherein said dynamically extracting some said parasitic effects from said circuit schematic comprises identifying critical nets in said circuit schematic.

7. The method as in claim 6, wherein said inserting some parasitic effects comprises dynamically obtaining said parasitic effects from a library in which said identified parasitic effects are associated with said identified critical nets.

8. The method as in claim 6, wherein said inserting includes accessing a parasitic aware library and associating said identified critical nets with said some parasitic effects in said parasitic aware library.

9. The method as in claim 5, wherein said dynamically extracting RLC effects and said dynamically extracting EM parasitic effects comprises hierarchical extraction.

10. The method as in claim 1, wherein said semiconductor device includes a plurality of said parasitic effects and said some parasitic effects represent a minority of said plurality of parasitic effects of said semiconductor device.

11. The method as in claim 1, wherein said simulating operation comprises simulation of a netlist of said circuit.

12. The method as in claim 1, further comprising, prior to said inserting some but not all parasitic effects, selecting said identified circuit paths, and wherein said identified circuit paths comprise nets of said circuit schematic.

13. The method as in claim 1, wherein said comparing comprises comparing a layout netlist extracted from said complete layout, to a schematic netlist extracted from said circuit schematic with said inserted some parasitic effects in said LVS (Layout Versus Schematic) check.

14. A method for semiconductor device circuit design, said method comprising:
   using a single circuit schematic for simulation, parasitic verification and comparison to a complete layout of a semiconductor integrated circuit by performing an LVS (Layout Versus Schematic) check using a computer;
   after said using, inserting all parasitic components of said layout, into said single circuit schematic through dynamic extraction thereby providing a parasitic-component containing version of said single circuit schematic; and
   producing a non-transitory computer readable storage media with instructions for building a mask set for said semiconductor device based on said parasitic-component containing version of said single circuit schematic,
   wherein said using comprises said single circuit schematic including netlists of some but not all parasitic effects therein at least during said simulation and during said comparison to a layout.

15. The method as in claim 14, wherein said using comprises extracting only a portion of said parasitic components of said complete layout by identifying critical paths of said single circuit schematic and inserting said portion of said parasitic components into said single circuit schematic at identified circuit paths, for said parasitic verification, said inserting including inserting at least one of a netlist and an s2p file.

16. A method for circuit design using a single circuit schematic for simulation, parasitic verification, and comparison to a layout, said method comprising:
   providing a non-transitory computer readable storage medium with a circuit schematic;
   identifying critical paths of said circuit schematic;
   accessing a library in which said critical paths are associated with estimated parasitic effects;
   inserting said estimated parasitic effects into said circuit schematic through dynamic extraction;
   generating a schematic netlist of said circuit using said circuit schematic with said inserted estimated parasitic effects;
   first simulating operation of said circuit using said netlist;
   generating a complete layout of a semiconductor integrated circuit device using a computer; and comparing said circuit schematic with said inserted estimated parasitic effects, to said complete layout by performing an LVS (Layout Versus Schematic) check using said computer.

17. The method as in claim 16, wherein said estimated parasitic effects comprise resistor-inductor-capacitor ("RLC") parasitic effects and electromagnetic ("EM") parasitic effects and said comparing comprises a layout netlist extracted from said complete layout, to said schematic netlist in said LVS (Layout Versus Schematic) check.

18. The method as in claim 17, wherein said inserting comprises inserting a netlist of said RLC parasitic effects and an s2p file of said EM parasitic components.

19. The method as in claim 16, further comprising, after said comparing:
   inserting all parasitic components of said complete layout, into said circuit schematic thereby providing a further netlist of a parasitic-component containing circuit; and
   carrying out a post-layout circuit simulation of said parasitic-component containing circuit using said further netlist.

* * * * *